(12) United States Patent
Ja et al.

(10) Patent No.: US 7,448,015 B2
(45) Date of Patent: Nov. 4, 2008

(54) METHOD AND SYSTEM FOR UNFOLDING/REPLICATING LOGIC PATHS TO FACILITATE MODELING OF METASTABLE VALUE PROPAGATION

(75) Inventors: Yee Ja, Round Rock, TX (US); Bradley S. Nelson, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 11/419,219

(22) Filed: May 19, 2006

(65) Prior Publication Data

US 2007/0271542 A1 Nov. 22, 2007

(51) Int. Cl.
G06F 17/50 (2006.01)
(52) U.S. Cl. .................... 716/12; 716/6; 716/7
(58) Field of Classification Search .............. 716/6, 716/12, 7; 717/7; 703/16
See application file for complete search history.

(56) References Cited

U.S. PATENT DOCUMENTS

| | | | | |
|---|---|---|---|---|
| 4,011,465 A | * | 3/1977 | Alvarez | ............... 327/141 |
| 5,287,289 A | * | 2/1994 | Kageyama et al. | ............ 716/18 |
| 5,826,061 A | | 10/1998 | Walp | |
| 5,905,766 A | * | 5/1999 | Nguyen | ...................... 375/354 |
| 7,159,199 B2 | * | 1/2007 | Warren | ......................... 716/6 |
| 7,299,436 B2 | * | 11/2007 | Chu et al. | ...................... 716/6 |
| 2003/0046618 A1 | | 3/2003 | Collins | |
| 2003/0125916 A1 | | 7/2003 | Benis | |

* cited by examiner

Primary Examiner—Sun J Lin
(74) Attorney, Agent, or Firm—Casimer K. Salys; Jack V. Musgrove

(57) ABSTRACT

A net of an integrated circuit design is analyzed by unfolding paths on the receive side of an asynchronous boundary to facilitate modeling of the propagation of a metastable value from a receive latch to sinks of the net. The paths are unfolded by replicating combinational logic and wiring along the coincident portions to form non-intersecting, separate paths from the receive latch to two or more sinks. Common data or control inputs are provided for the gates in the replicated combinational logic. Driver logic may additionally be inserted along each replicated path, upstream of the combinational logic, to independently drive each of the sinks.

6 Claims, 5 Drawing Sheets

METHOD AND SYSTEM FOR UNFOLDING/REPLICATING LOGIC PATHS TO FACILITATE MODELING OF METASTABLE VALUE PROPAGATION

CROSS-REFERENCE TO RELATED APPLICATION

This application is related to U.S. patent application Ser. No. 11/054,903 entitled "SYSTEM AND METHOD FOR UNFOLDING/REPLICATING LOGIC PATHS TO FACILITATE PROPAGATION DELAY MODELING" filed Feb. 10, 2005, which is hereby incorporated.

BACKGROUND OF THE INVENTION

1. Field of the Invention

The present invention generally relates to the fabrication and design of semiconductor chips and integrated circuits, and more particularly to a method of modeling the propagation of a metastable value in a net of an integrated circuit design having an asynchronous boundary.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Faster performance and predictability of responses are elements of interest in circuit designs. As process technology scales to the deep-submicron (DSM) regime, clock-related problems such as clock skew (jitter) and worst-case execution time are becoming increasingly important to the performance and reliability of IC chips and systems. Asynchronous circuits are often used in situations where such clock-related problems cannot be tolerated, but asynchronous circuit designs are difficult to test. Consequently, modeling of asynchronous circuits has become crucial to achieving an accurate system analysis, particularly the modeling of asynchronous connections between multiple synchronous clock domains (asynchronous boundaries).

With synchronous logic, static timing is performed to ensure that when a latch transitions, the correct value will meet the timing requirements of any downstream latch. One clock cycle is enough time for the transitioning value to be seen on the latch input without violating the setup requirements for that latch. Unfortunately, with asynchronous boundaries it is unrealistic to maintain static timing requirements because the receive latch may be clocked at any time after the send latch transitions. The transitioning data may not have had enough time to reach the input of the receive latch, and if the new value of the send latch fails to reach the receive latch prior to its sampling of the input, the prior value will the latched. If the transition occurs within the setup time required by the receive latch, the latch may become metastable. For a receive clock period, an old (pre-transition) value or new (post-transition) value may be latched, or the latch may be metastable for that clock period. This metastable value can be interpreted by downstream logic as either a 0 or 1 value. Even on the same net, noise can drive one sink to interpret the value differently from another sink. Modeling this behavior is very difficult since the effects of metastability and noise cannot be accurately predicted. Many factors combine to make the propagation rate of a transitioning signal variable for different paths in a net, including different wire lengths and different gating logic through which the signal must traverse.

In light of the foregoing, it would be desirable to devise an improved method of analyzing a net of an integrated circuit design having an asynchronous boundary, to better model the propagation of a potentially metastable value. It would be further advantageous if the method could simulate the effects of metastability at sinks having a common source in a controlled fashion.

SUMMARY OF THE INVENTION

It is therefore one object of the present invention to provide an improved method of simulating the behavior of a net of an integrated circuit design having an asynchronous crossing.

It is another object of the present invention to provide such a method which models the propagation of a metastable value to sinks of the net.

It is yet another object of the present invention to provide a method for driving different values to different sinks of a net having a common source to simulate the effects of metastability.

The foregoing objects are achieved in a method of modeling propagation of a metastable value in an integrated circuit design, by receiving a circuit description for a net of the integrated circuit design wherein the net has an asynchronous crossing from a source in a first clock domain to a receive latch in a second clock domain, identifying at least one path in the circuit description from the receive latch to two or more sinks of the net wherein the path has a coincident portion with combinational logic and wiring, and unfolding the coincident portion of the path by replicating the combinational logic and wiring to create a modified circuit description having two or more non-intersecting, separate paths from the receive latch to the two or more sinks, respectively. In the implementation wherein the replicated combinational logic for each of the non-intersecting, separate paths includes at least one gate having a data input and a control input, the replicated gates for all of the non-intersecting, separate paths have a common control input. The transformation may be applied to additional levels of the circuit description wherein the two or more sinks are sink latches and the receive latch and the sink latches define a first level of a receive side of the net, and the method further identifies at least one other path in the circuit description from one of the sink latches to two or more additional sinks of the net which define a second level of the receive side of the net, downstream from the first level, wherein the other path has another coincident portion with different combinational logic and wiring, and unfolds the other coincident portion of the other path in the second level of the receive side of the net by replicating the different combinational logic and wiring to create a further modified circuit description having another two or more non-intersecting, separate paths from the one sink latch to the two or more additional sinks, respectively. Driver logic may be inserted along each replicated path, upstream of the combinational logic, to independently drive each of the sinks. The driver logic may have an output which is based on a combination of a present output from the receive latch, a delayed output from the receive latch, and a random value.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention provides a novel method for unfolding/replicating logic paths to facilitate modeling of metastable value propagation in a net of an integrated circuit design. By identifying the paths originating from a latch which can become metastable due to an asynchronous boundary, it is possible to replicate associated logic in order to provide non-intersecting and essentially separate paths from the latch to each downstream sink. As explained further below, unfolding of the logic paths further allows the insertion of driver logic on each unique path such that different values can be driven for each sink when the latch is known to be metastable.

Figure 1:
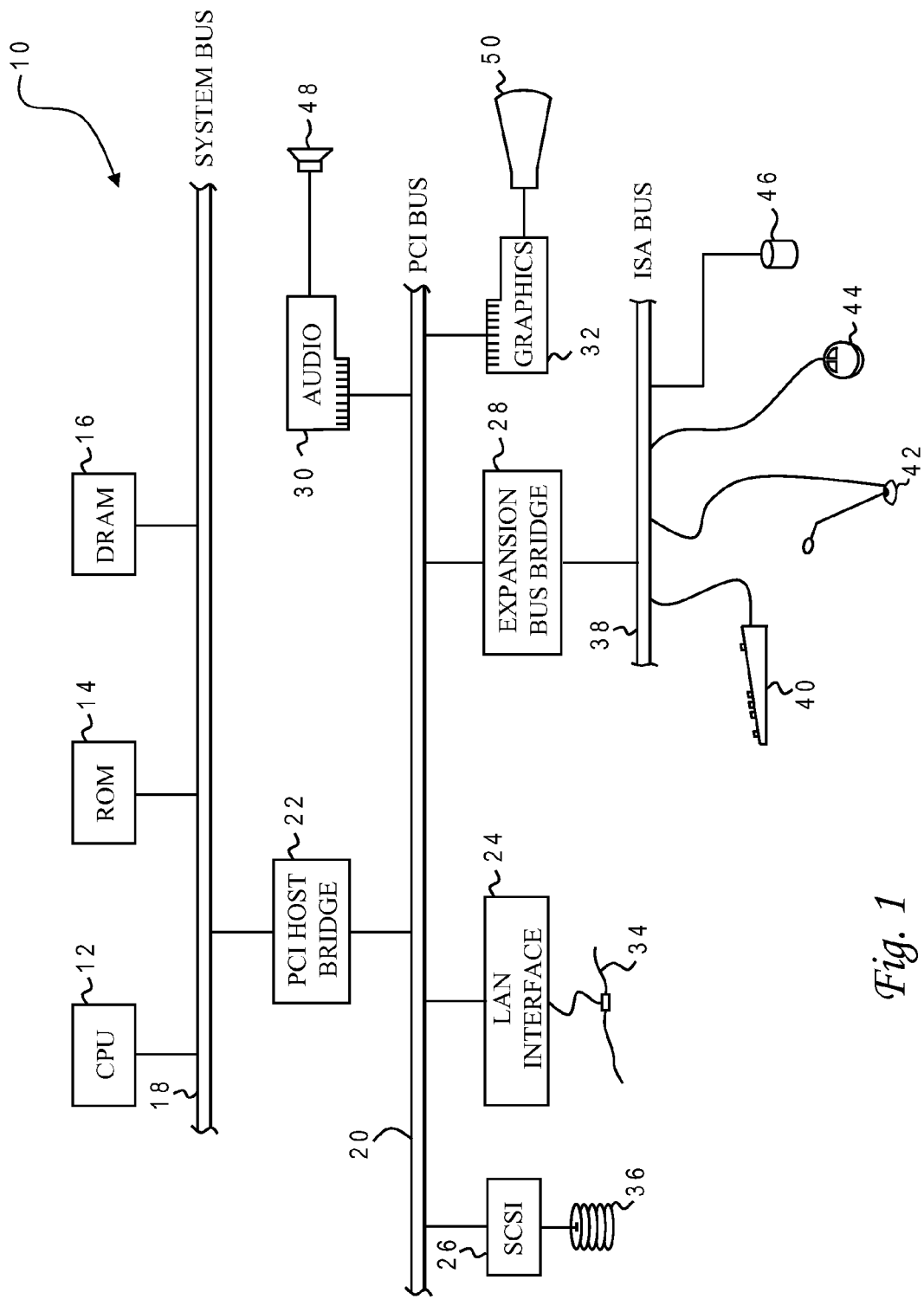
FIG. 1 is a block diagram of one embodiment of a computer system programmed to carry out modeling of metastable value propagation of a circuit in accordance with the present invention.

With reference now to the figures, and in particular with reference to FIG. 1, there is depicted one embodiment 10 of a computer system programmed to carry out the path replication in accordance with one implementation of the present invention. System 10 includes at least one central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory. One such high performance system is the IBM eServer pSeries™ data processing system using an AIX or LINUX operating system.

CPU 12, ROM 14 and DRAM 16 are coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44.

Other devices may also be attached to ISA bus 38, such as a CD-ROM drive 46. Audio adapter 30 controls audio output to a speaker 48, and graphics adapter 32 controls visual output to a display monitor 50, to allow the user to carry out the metastable value propagation modeling as taught herein.

While the illustrative implementation provides the program instructions embodying the present invention on disk drive 36, those skilled in the art will appreciate that the invention can be embodied in a program product utilizing other computer-readable media, including transmission media. The program instructions may be written in the C++ programming language for an AIX environment. System 10 may have additional programs that include conventional circuit design tools, e.g., to generate an original netlist or other circuit description, and to analyze the modified netlist that is created by the present invention.

Figure 2A:
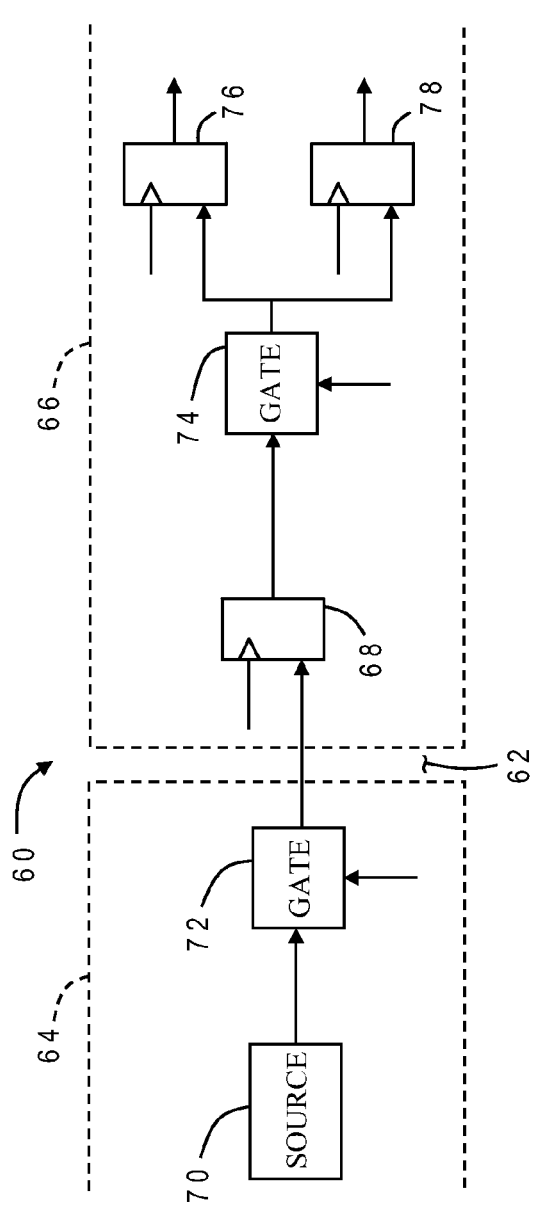
FIG. 2A is a high-level schematic diagram of an exemplary net which is to be analyzed wherein the net has an asynchronous crossing between synchronized clock domains.

Computer system 10 carries out program instructions for a modeling process in which the targeted nets have asynchronous boundaries which may lead to metastability. FIG. 2A illustrates a simplified example of a net 60 having such an asynchronous boundary 62 between a first synchronous clock domain 64 and a second synchronous clock domain 66. Net 60 may be provided to computer system 10 in the form of a circuit description such as a netlist or a higher level description in, e.g., HDL or Verilog. Circuitry in first synchronous clock domain 64 drives a value to a receive latch 68 in second synchronous clock domain 66. The circuitry in first synchronous clock domain 64 may be more complicated than that shown, but in this example it includes only a source 70 connected to the data input of a gate 72. Source 70 may be a direct input to the net, or it may be another latch. Gate 72 generally represents any combinational logic, i.e., one or more logic gates (AND, OR, NOR, XOR, etc.) having other data inputs or control signals. The output of gate 72 is connected to the data input of receive latch 68 across asynchronous boundary 62. Latch 68 has an enable line or clock signal which is used to capture the value at the data input. The output of latch 68 is connected to another gate 74 which again generally represents any form of combinational logic. The output of gate 74 is further connected to the data inputs of two latches 76, 78 which also have respective enable lines. The circuitry in second synchronous clock domain 66 may also be more complicated than that shown in FIG. 2A.

Latches 76, 78 are sinks of net 60. However, the terms "sink," "source" and "receive latch" are all relative to the particular net being analyzed. Source 70 could be a latch which is concurrently a sink of another (upstream) net, and sinks 76, 78 on the receive side 66 of asynchronous boundary 62 could act as sources for other (downstream) nets. The specific construction of the gates or latches is generally immaterial to the present invention since it is applicable to the higher-level circuit description regardless of the particular technology.

Figure 2B:
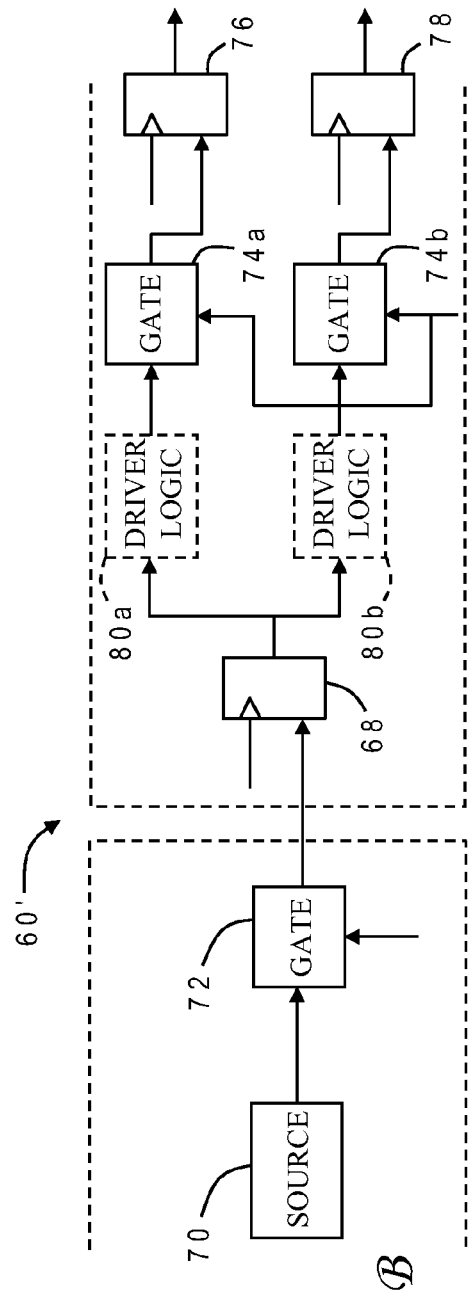
FIG. 2B is a high-level schematic diagram of a transformation of the net of FIG. 2A illustrating replication of a path from a receive latch to downstream sinks, in accordance with one implementation of the present invention.

As explained in the Background section, asynchronous crossing 62 may lead to metastability in receive latch 68 in a physical implementation of the circuit, which can further result in different values being evaluated by sink latches 76, 78. Consequently, modeling of net 60 using the circuit description of FIG. 2A does not allow the designer to properly simulate the propagation of a metastable value. The present invention provides a transformation to facilitate the modeling of metastable value propagation. As seen in FIG. 2B, the invention unfolds the coincident portions of the paths from receive latch 68 to sink latches 76, 78 into completely separate paths, by replicating the wiring and any combinational logic such that there is a unique gate (or set of gates) for each path to each unique endpoint/sink. Accordingly, gate 74 from net 60 of FIG. 2A is replaced with two gates 74a and 74b in the transformed net 60' of FIG. 2B. The outputs of gates 74a, 74b are respectively connected to the data inputs of latches 76, 78. The common control or data input for gate 74 is used to branch out to both gate 74a and gate 74b.

The output of receive latch 68 may correspondingly branch out in two separate paths to gates 74a, 74b, but in the preferred implementation driver logic 80a, 80b is added to the circuit description upstream of the combinational logic so that each divergent path can be driven independently. Receive latch 68 is thus connected to the input of each driver logic 80a, 80b, and the outputs of driver logic 80a, 80b are respectively connected to the inputs of gates 74a, 74b. Any driving logic is suitable as long as it is capable of producing different values on the different paths, including a random driver for binary simulation (one driver is instantiated for each path). In particular the driver logic may provide an output which is based on a combination of a present output from receive latch 68, a delayed output from receive latch 68, and a random value, as more fully described in U.S. patent application Ser. No. 11/360,906 entitled "MODELING ASYNCHRONOUS BEHAVIOR FROM PRIMARY INPUTS AND LATCHES," filed Feb. 23, 2006, which is hereby incorporated.

Figure 3A:
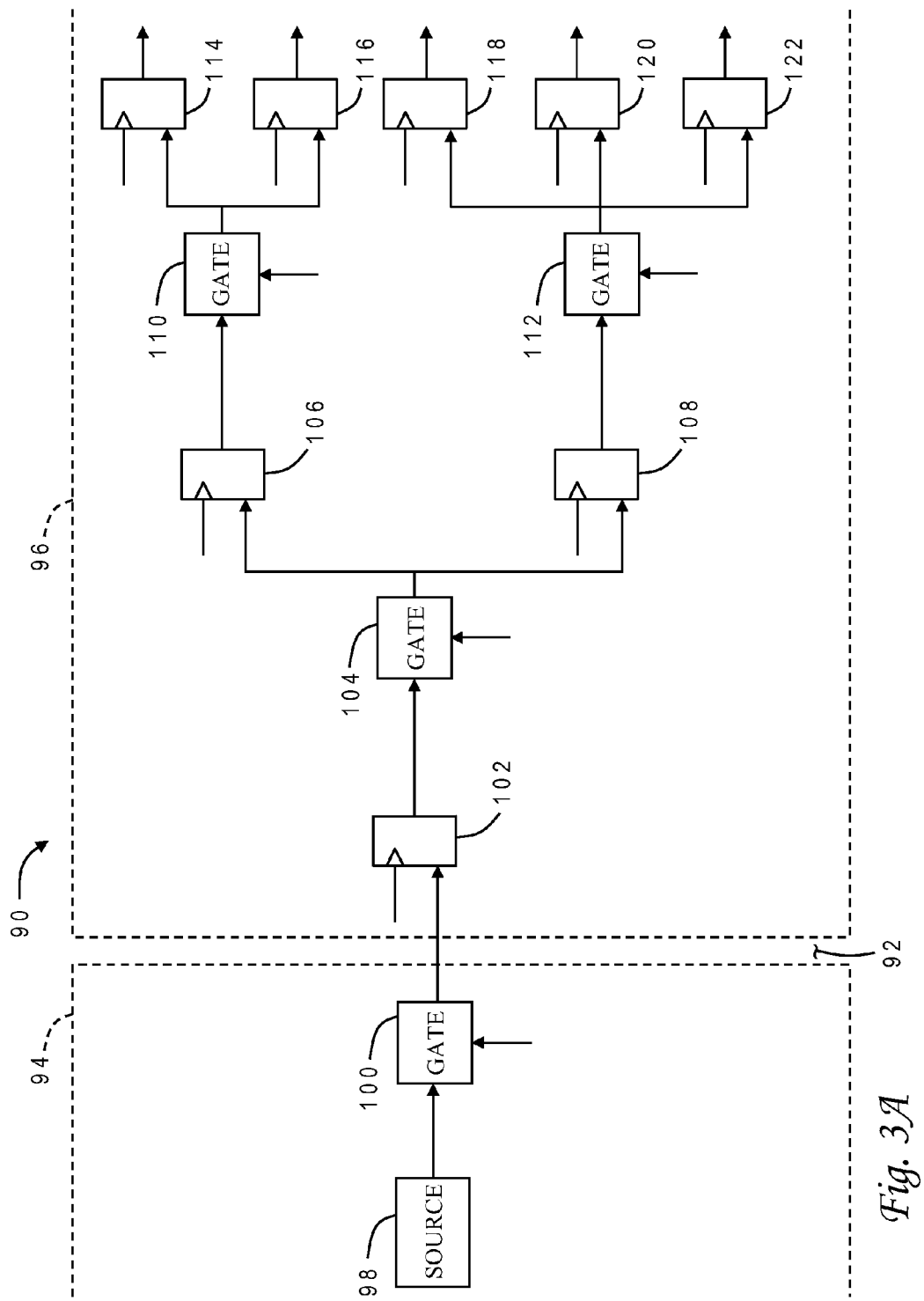
FIG. 3A is a high-level schematic diagram of another exemplary net which is to be analyzed wherein the net has multiple layers of sinks and gating logic.
Figure 3B:
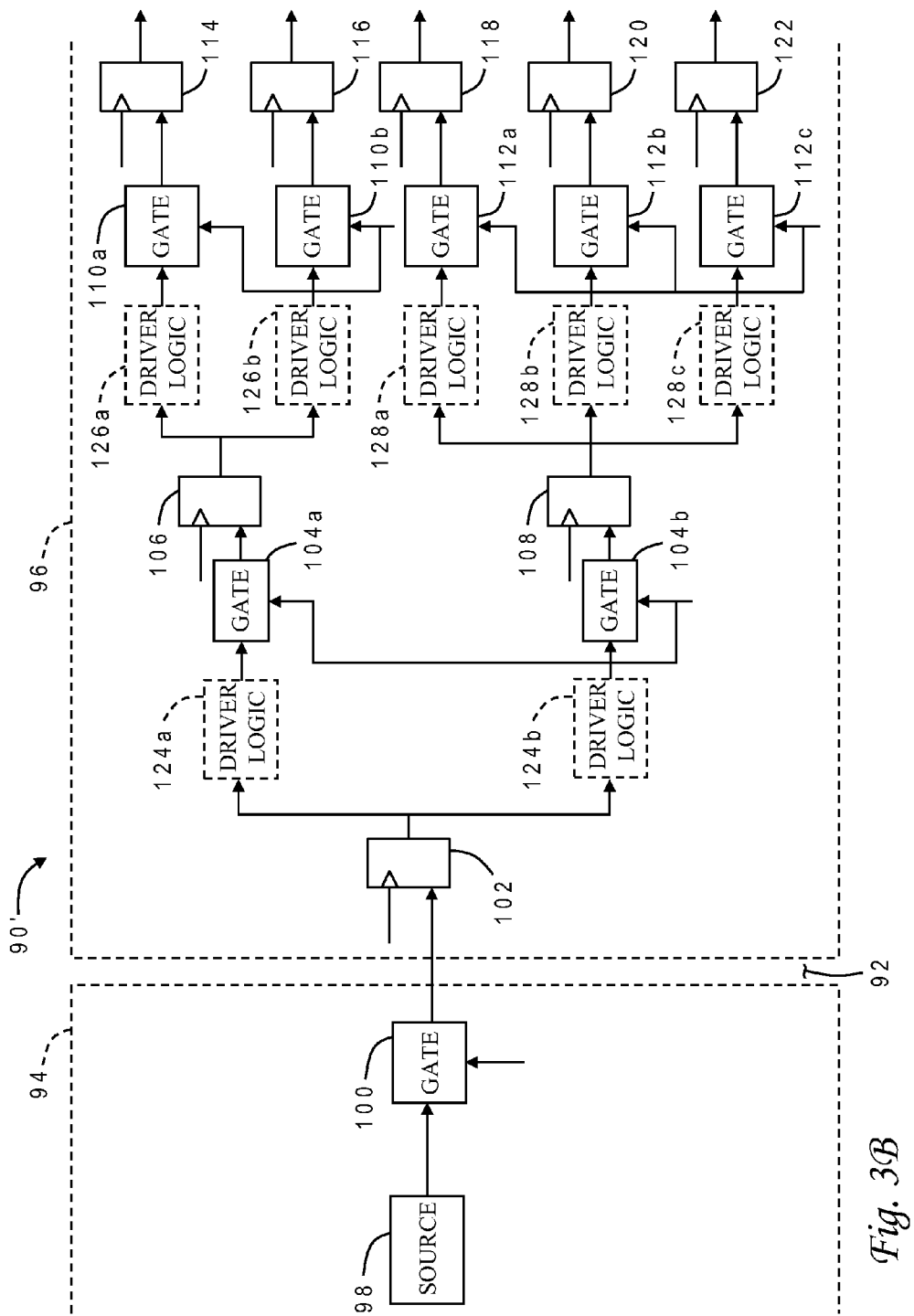
FIG. 3B is a high-level schematic diagram of a transformation of the net of FIG. 3A illustrating replication of the path from the receive latch to the first layer of downstream sinks and replication of additional paths from the first layer of downstream sinks to a second layer of downstream sinks, in accordance with one implementation of the present invention.

Depending on the speed of the circuit and the particular technology, the circuit transformation may benefit from additional layers of path replication to fully alleviate the effects of metastability. FIGS. 3A and 3B illustrate another example of the present invention wherein path replication on the receive side of an asynchronous boundary is carried out at two different levels. A net 90 has an asynchronous boundary 92 between a first synchronous clock domain 94 and a second synchronous clock domain 96. A source 98 and a gate 100 in first synchronous clock domain 94 drive a value to a receive latch 102 in second synchronous clock domain 96. The output of latch 102 is connected to an input of another gate 104 in receive side 96. The output of gate 104 is connected to the data inputs of two latches 106, 108. The output of latch 106 is further connected to an input of another gate 110 while the output of latch 108 is further connected to an input of another gate 112. The output of gate 110 drives two more latches 114, 116, and the output of gate 112 drives three more latches 118, 120, 122.

In the transformation of FIG. 3B, the new net 90' has replicated gate 104 into two gates 104a, 104b, and replicated the wiring from latch 102 to those gates. Driver logic 114a, 114b may also be inserted along those replicated paths. This unfolding of the paths from latch 102 to latches 106, 108 takes place at a first level of the receive side of the net. Further unfolding takes place at a second level of the receive side of the net, i.e., defined by the paths from latch 106 to latches 114, 116, and by the paths from latch 108 to latches 118, 120, 122. In other words, gate 110 is replicated into gates 110a, 110b (and driver logic 126a, 126b is inserted in those respective paths), and gate 112 is replicated into gates 112a, 112b, 112c (and driver logic 128a, 128b, 128c is inserted in those respective paths). Accordingly, each of the final paths to the five sinks in the second level (latches 114, 116, 118, 120, 122) can be driven independently to model the propagation of a metastable value.

Figure 4:
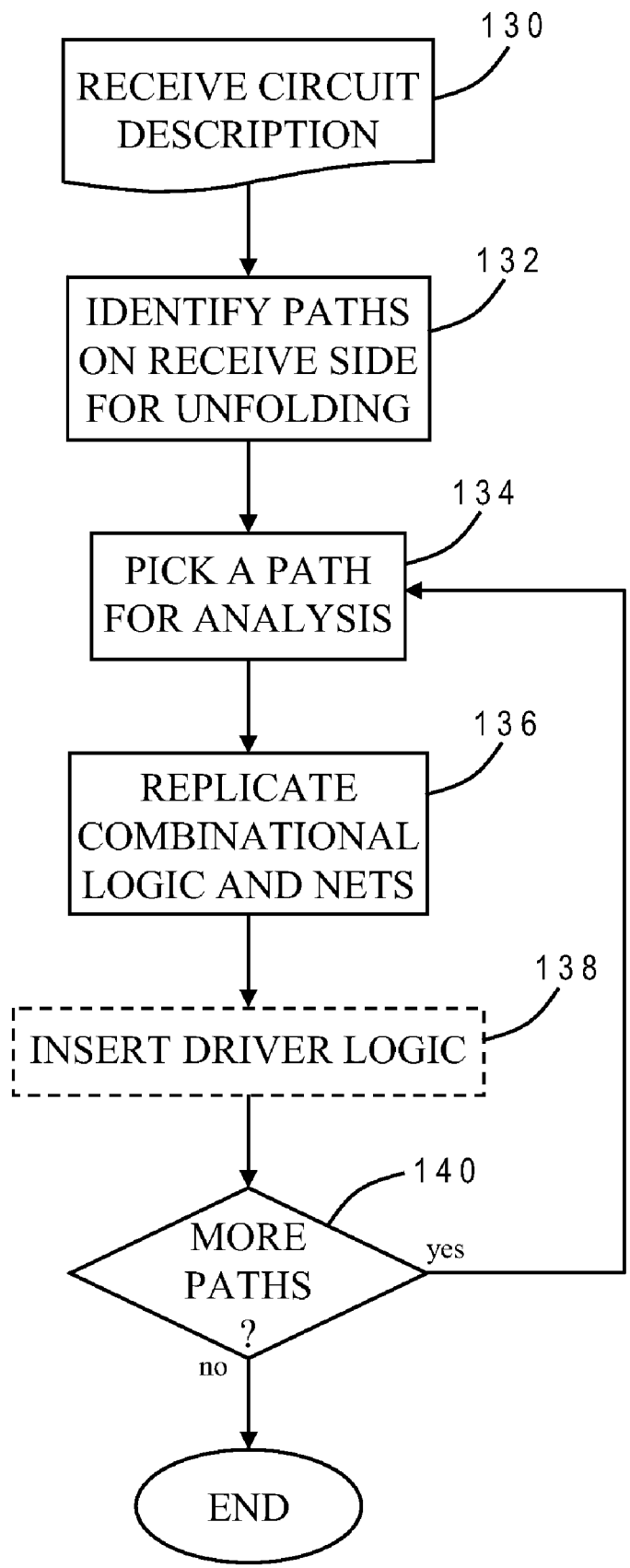
FIG. 4 is chart illustrating the logical flow for modeling metastable value propagation in accordance with one implementation of the present invention.

The present invention may be further understood with reference to the chart of FIG. 4 which illustrates the logical flow for modifying a circuit design in accordance with the present invention. The process begins by receiving a circuit description such as a netlist or a higher level description (130). The circuit description is examined to identify any paths on the receive side of an asynchronous circuit and determine which of these paths is desirable to unfold (132). A path is then picked for analysis, preferably starting with the paths from the highest source in the tree structure of the net (134). For that path, the combinational logic (gating) and the wiring are then replicated (136), and driver logic may be inserted along each replicated path (138). If there are more paths in the net which require unfolding (140), the process repeats iteratively at step 134, until all desired paths have been replicated. The entire process illustrated in FIG. 4 may be repeated for any additional nets in the integrated circuit design.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of modeling propagation of a metastable value in an integrated circuit design, the method comprising:

receiving a circuit description for a net of the integrated circuit design, wherein the net has an asynchronous crossing from a source in a first clock domain to a receive latch in a second clock domain;

identifying at least one path in the circuit description from the receive latch to two or more sinks of the net in the second clock domain, wherein the at least one path has a coincident portion with combinational logic and wiring; and unfolding the coincident portion of the at least one path by replicating the combinational logic and wiring to create a modified circuit description having two or more separate paths from the receive latch to the two or more sinks, respectively.

2. The method of claim 1 wherein the replicated combinational logic for each of the two or more separate paths includes at least one gate having a data input and a control input.

3. The method of claim 2 wherein replicated gates for all of the two or more separate paths have a common control input in the replicated combinational logic.

4. The method of claim 1 wherein the two or more sinks are sink latches and the receive latch and the sink latches define a first level of a receive side of the net, and the method further comprising:

identifying at least one other path in the circuit description from one of the sink latches to two or more additional sinks of the net which define a second level of the receive side of the net, downstream from the first level, wherein the at least one other path has another coincident portion with different combinational logic and wiring; and unfolding the another coincident portion of the at least one other path in the second level of the receive side of the net by replicating the different combinational logic and wiring to create a further modified circuit description having another two or more separate paths from one of the sink latches to the two or more additional sinks, respectively.

5. The method of claim 1, further comprising inserting driver logic along each replicated path, upstream of the combinational logic, to independently drive each of the two of more sinks.

6. The method of claim 5 wherein the driver logic has an output which is based on a combination of a present output from the receive latch, a delayed output from the receive latch, and a random value.

* * * * *